US010985669B2

(12) United States Patent
Böhmer et al.

(10) Patent No.: US 10,985,669 B2
(45) Date of Patent: Apr. 20, 2021

(54) PHASE MODULE FOR A POWER CONVERTER

(71) Applicant: SIEMENS AKTIENGESELLSCHAFT, Munich (DE)

(72) Inventors: Jurgen Böhmer, Stein (DE); Rüdiger Kleffel, Erlangen (DE); Eberhard Ulrich Krafft, Nuremberg (DE); Jan Weigel, Grossenbuch (DE); Stefan Boigk, Stein (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/300,402

(22) PCT Filed: Mar. 24, 2017

(86) PCT No.: PCT/EP2017/057080
§ 371 (c)(1),
(2) Date: Nov. 9, 2018

(87) PCT Pub. No.: WO2017/194243
PCT Pub. Date: Nov. 16, 2017

(65) Prior Publication Data
US 2019/0149059 A1    May 16, 2019

(30) Foreign Application Priority Data
May 10, 2016    (EP) .................................. 16168984

(51) Int. Cl.
*H02M 1/00*    (2006.01)
*H05K 7/14*    (2006.01)
(Continued)

(52) U.S. Cl.
CPC ............ *H02M 7/003* (2013.01); *H01L 25/115* (2013.01); *H02B 1/20* (2013.01); *H02M 7/48* (2013.01); *H05K 7/1432* (2013.01)

(58) Field of Classification Search
CPC .......... H02M 7/003; H02M 7/48; H02B 1/20; H01L 25/115; H05K 7/1432
See application file for complete search history.

(56) References Cited

U.S. PATENT DOCUMENTS 5,414,616 A    5/1995 Hatozaki
5,777,377 A *  7/1998 Gilmore ............ H01L 23/49575
                                                    257/584
(Continued)

FOREIGN PATENT DOCUMENTS

DE    44 02 425 A1    8/1994
DE    198 33 491 A1    2/2000
(Continued)

OTHER PUBLICATIONS

PCT International Search Report and Written Opinion of International Searching Authority dated Jun. 30, 2017 corresponding to PCT International Application No. PCT/EP2017/057080 filed Mar. 24, 2017.
(Continued)

*Primary Examiner* — Edward Chin
(74) *Attorney, Agent, or Firm* — Henry M. Feiereisen LLC (57) ABSTRACT

A phase module for a power converter includes first and second busbars and at least two semiconductor modules. The first busbar is connected to AC voltage connections of the semiconductor modules. The second busbar is connected to DC voltage connections of the semiconductor modules. At least one section of the first and second busbars is arranged at a distance to one another, the value of which is less than half the value of the distance between the AC voltage
(Continued)

connection and the DC voltage connection of one of the semiconductor modules. At least one of the busbars has a separator arranged at a right angle on the remaining part of the busbar and connecting the busbar to at least one of the DC voltage connections or one of the AC voltage connections of one of the semiconductor modules. The separator is arranged along a surface of the one semiconductor module.

16 Claims, 5 Drawing Sheets

(51) Int. Cl.
*H01L 25/11* (2006.01)
*H02B 1/20* (2006.01)
*H02M 7/48* (2007.01)
*H02M 7/00* (2006.01)

(56) References Cited

U.S. PATENT DOCUMENTS

| | | |
|---|---|---|
| 6,456,516 B1 | 9/2002 | Bruckmann et al. |
| 2007/0177358 A1 | 8/2007 | Schilling et al. |
| 2011/0235276 A1 | 9/2011 | Hentschel et al. |
| 2016/0006371 A1* | 1/2016 | Nesemann ............ H02M 7/003 363/131 |

FOREIGN PATENT DOCUMENTS

| | | |
|---|---|---|
| DE | 10 2005 004 031 B3 | 3/2007 |
| DE | 10 2013 102 707 A1 | 9/2014 |
| DE | 10 2015 210 563 A1 | 12/2015 |
| EP | 1445853 A2 * | 8/2004 ........... H05K 7/1432 |
| EP | 3 185 660 A1 | 12/2015 |
| GB | 25 29 018 A | 2/2016 |
| RU | 2514734 C2 | 5/2014 |

OTHER PUBLICATIONS

Rüdiger Kleffel, U.S. Pat. No. 9,053,869, Jun. 9, 2015, 2012-0139492, Jun. 7, 2012.

* cited by examiner

PHASE MODULE FOR A POWER CONVERTER

CROSS-REFERENCES TO RELATED APPLICATIONS

This application is the U.S. National Stage of International Application No. PCT/EP2017/057080, filed Mar. 24, 2017, which designated the United States and has been published as International Publication No. WO 20171194243 and which claims the priority of European Patent Application, Serial No. 16168984.9, filed May 10, 2016, pursuant to 35 U.S.C. 119(a)-(d).

BACKGROUND OF THE INVENTION

The invention relates to a phase module for a power converter comprising a first and a second busbar and at least two semiconductor modules, wherein the first busbar is connected to AC voltage connections of the semiconductor modules, wherein the second busbar is connected to DC voltage connections of the semiconductor modules. The invention further relates to a power converter and a method for operating a phase module of this type or a power converter of this type.

Power converters are used to supply electrical consumers, such as, for example, motors with electrical energy. Herein, power converters can provide a voltage with a variable voltage level and variable frequency at their AC voltage outputs.

The individual AC voltage outputs of the power converter are referred to as phases. The individual phases in the power converter can be formed by so-called semiconductor modules.

A semiconductor module comprises one AC voltage connection and at least two DC voltage connections. The semiconductor module is generally an arrangement with at least two semiconductor switches, which enable the AC voltage connection to be electrically connected to one of the two or more DC voltage connections. Switching the semiconductor switches enables a predefinable voltage to be generated at the AC voltage connection over a time average.

The semiconductor switches are, for example, IGBTs, which change their switching status (conducting/blocking) in dependence on their control. IGBTs can be operated with a high switching frequency. A simple embodiment of a semiconductor module with two DC potentials is for example a so-called half-bridge. The half-bridge comprises a series connection of two semiconductor switches, wherein the interconnection point between the two semiconductor switches is the AC voltage connection. The DC voltage connections are located on the outer edge of the series connection.

The electrical performance capability of a phase of the power converter can be improved by an electrically parallel arrangement of a plurality of power converters. Herein, the total current is equal to the sum of the module currents of the individual semiconductor modules. Herein, the module current is the current that flows through the corresponding semiconductor module during operation. With parallel connection, i.e. an electrically parallel arrangement, of the semiconductor modules, each of the different DC voltage connections and AC voltage connections of the various semiconductor modules are, for example, connected to one another by means of busbars. Hereinafter, such an arrangement is referred to as a phase module.

Depending upon their cross section, busbars are suitable for carrying high currents. Busbars have lower inductance than cables. Their low inductance makes busbars in particular suitable for semiconductor modules, in particular for power semiconductors, which are operated at high switching frequencies. Modern IGBT modules in particular belong to the group of power semiconductors or semiconductor modules that allow operation at a high switching frequency.

Herein, busbars are usually made of copper because of the high conductivity. Due to the high price of copper, the cross sections and conduction paths are optimized in order to minimize use of materials and hence also the costs of busbar systems.

In addition to phase modules with two DC voltage connections, there are also phase modules with more than two DC potentials, in particular three or five potentials, which are used to construct a 3-point, 5-point or, generally, n-point power converter.

The European patent application with the filing reference 15 201 849.5 discloses a busbar arrangement with which two busbars are arranged with the greatest possible degree of overlapping for connection to a DC intermediate circuit in order to reduce disruptive electrical fields at the connections of the semiconductor switches. This enables the semiconductor switches to be switched at high frequencies.

SUMMARY OF THE INVENTION

The invention is based on the object of improving a phase module with electrically parallel semiconductor modules with respect to its operational performance.

The object is achieved by a phase module for a power converter comprising a first and a second busbar and at least two semiconductor modules, wherein the first busbar is connected to AC voltage connections of the semiconductor modules, wherein the second busbar is connected to DC voltage connections of the semiconductor modules, wherein the first and the second busbar are arranged, at least in sections, at a distance to one another the value of which is the half the value of the distance between the AC voltage connection and the DC voltage connection of one of the semiconductor modules. The object is furthermore achieved by a power converter with at least two such phase modules, in particular with three such phase modules, wherein the AC voltage connections of the phase modules form the phases of the power converter. The object is furthermore achieved by a method for operating a phase module of this type or a power converter of this type, wherein the control of the parallel semiconductor modules occurs independently of the module current through the respective semiconductor switch.

Advantageous embodiments of the invention are disclosed in the dependent claims.

The invention is based on the discovery that current splitting between electrically parallel semiconductor modules can be improved if the individual current paths through the semiconductor modules have the same inductance. The current paths are meshes extending from the intermediate circuit via at least one semiconductor module in each case to the load and back to the intermediate circuit. Low inductance is in particular advantageous when the semiconductor modules are operated at a high switching frequency since, with increasing frequency, inductance has a greater influence on the current distribution of the individual, parallel semiconductor modules than the ohmic component. In high frequency operations, in particular in or above the kilohertz (kHz) range, even low inductance or low differences in inductance have a relatively high influence on current distribution (also referred to as current splitting) between the individual semiconductor modules.

If the current branches through the parallel semiconductor modules have the same inductance, it is possible to achieve uniform, or at least almost uniform, splitting of the total current into the individual module currents in the respective semiconductor modules. The module currents of individual parallel semiconductor modules are then the same, or almost the same.

Herein, with the electrically parallel arrangement of the semiconductor modules, these are connected in parallel through the respective busbars both with respect to their AC voltage connections and with respect to their DC voltage connections.

In power electronics, the construction of power converters frequently requires parallel connection of semiconductor modules in order to enable higher currents to be conducted in the individual phases than is possible with individual semiconductor modules. This moreover advantageously enables a power converter to be constructed as modular and scaled over the number of parallel-connected semiconductor modules and hence adapted to the required performance capability. Herein, the semiconductor modules used are preferably IGBT modules. Due to their high switching frequency with a simultaneously high power to be transmitted through the phase module or through the power converter, these are particularly susceptible to differences in the inductance of the current paths through the individual, parallel semiconductor modules. In other words, a different inductance in the individual meshes or the individual current paths through the different parallel semiconductor modules, inter alia due to the high switching frequencies, which are in the kilohertz (kHz) range, in particular range of from 1 kHz to 20 kHz, causes a particularly high maldistribution of currents through the parallel semiconductor modules. Maldistribution is manifested in different module currents through the individual parallel-connected semiconductor modules. Herein, the performance capability of the individual semiconductor modules is to some extent only utilized unsatisfactorily.

The inductance of the different current paths is inter alia determined by the area enclosed by the current path of the respective module current. It has been shown that herein in particular the portions of the area located in the vicinity of the semiconductor modules are of great importance.

In order to ensure that enclosed areas of the current paths of the different module currents, the sum of which forms the total current AC voltage connection, are the same size, it has been found to be advantageous to arrange the first busbar for connecting the AC voltage connections and the second busbar connecting the DC voltage connections, at least in sections, at the shortest possible distance to one another.

Since the semiconductor module has at least two DC potentials, in addition to this DC voltage connection, it also has at least one further DC voltage connection, which during operation has a different electric potential than the DC voltage connection. A third busbar can be provided to connect these further DC voltage connections. It has been found to be advantageous also to arrange the third busbar as close as possible to the first and second busbar. Herein, the same criterion can be used for the distance between the first busbar and third busbar as for the distance between the first and second busbar. Hence, in an advantageous embodiment of the invention the first and the third busbar can be arranged, at least in sections, at a distance to one another the value of which is less than the half the value of the distance between the AC voltage connection and the further DC voltage connection of one of the semiconductor modules.

The second and third busbar are embodied as electrically insulated from one another since they have different electric potentials during operation.

Hitherto, the busbars are primarily arranged from the point of view of material usage. Therefore, the busbars for AC voltage connection and DC voltage connection are arranged approximately at the distance which, disregarding the width of the busbars, corresponds to the distance between the AC voltage connection and the DC voltage connection on the semiconductor module. If the busbars are arranged significantly closer to one another, in particular with only a halving of the distance, an adaptation of the inductances of the current paths (meshes) of the individual module currents is observed that results in much better current splitting between the semiconductor modules. This reduces the maldistribution between the individual semiconductor modules. An even shorter distance results in a further improvement of the current splitting or a further reduction of the maldistribution.

The advantage of the phase module in particular consists in the fact that the shortened distance minimizes the influence of the inductively induced voltages (self-inductance and inductive coupling) on the module currents through the parallel-connected semiconductor modules, in particular the IGBTs. Then ohmic components and voltages arising at these ohmic components predominate. This achieves more uniform current splitting between the individual semiconductor modules in the parallel connection. Hence, the utilization of the current-carrying capacity of the semiconductor modules, in particular the IGBT modules, can be improved and over-dimensioning of the semiconductor modules can be reduced or even completely eliminated. In addition, the dependence of the current splitting in the parallel connection on the guidance of the line for the load current is minimized or eliminated so that the dimensioning of semiconductor modules and the installation of the connecting lines to the load of the power converter or the phase module can take place independently of one another.

It is particularly advantageous for the cross sections of the busbars, which substantially determine the current-carrying capacity of the busbar to be designed for the current-carrying capacity of the semiconductor modules. This enables particularly favorable utilization of the expensive copper material for the busbar to be achieved.

A plurality of phase modules can be combined to form a power converter. Herein, the AC voltage connections of the different phase modules form a phase of the power converter. Hence, for example, a three-phase power converter requires three phase modules in order to implement these three phases. The load is connected to the phases of the power converter. A typical load for a power converter is one or more motors. A single-phase power converter can be formed in a simple manner, for example by using one phase module.

To form the power converter, the DC voltage connections of the phase modules are connected to the intermediate circuit of the power converter, in particular to the intermediate-circuit capacitor.

Since the arrangement according to the invention causes the total current to be split uniformly, or at least almost uniformly, between the individual module currents, it is possible to dispense with automatic control measures for regulating the current splitting. Hence, the semiconductor modules can be controlled independently of the module current through the respective semiconductor module.

In an advantageous embodiment of the invention, the first and the second busbar are arranged, at least in sections, at a distance to one another the value of which is of an order of magnitude that ensures reliable insulation between the first and second busbar. The simplest type of insulation is ensured by air between the busbars. Herein, the size of the air gap between the busbars, or the distance between the busbars (air clearance) is selected such that there can be no flashovers between the busbars. This has the advantage that the busbars then have a particularly close and compact arrangement. This enables particularly good current splitting to be achieved since the areas spanned by the module currents are almost identical. The busbars can be fixed to another by connectors. As a result, the busbars are easy to handle and assemble, in particular during installation. The short distance between the busbars enables the connectors to have a particularly small compact design. The connectors comprise insulating material in order to prevent current flow between the busbars through the connectors.

To flashover, i.e. unwanted current flow, between the first and the second busbar, including under hostile environmental conditions, such as, for example, particularly moist or polluted air, it has been found to be advisable to provide the distance between the first and the second busbar with a safety margin. Hence, it is suggested that the distance between the first and the second busbar is of an order of magnitude that ensures reliable insulation. The person skilled in the art will understand the order of magnitude to include distances of up to 10 times greater than those that would be required for insulation with air under normal or ideal circumstances.

In a further advantageous embodiment of the invention, the first and the second busbar are arranged, at least in sections, at a distance to one another the value of which is less than the value of the width or thickness of the first and/or second busbar. This arrangement produces a particularly compact busbar design. Herein, the busbars can be attached electrically insulated from one another so that the installation of the busbars on the semiconductor modules can take place in a particularly simple manner. If a potential difference between the phases envisaged during operation would require a greater distance between the first and second busbar, an insulating material, for example a plastic or ceramic, can be introduced between the busbars. This permits reliable insulation of the busbars from one another, even at a smaller distance compared to the use of air as an insulating medium.

In a further advantageous embodiment of the invention, the first and the second busbar are arranged parallel to one another in the region of the semiconductor modules. Parallel arrangement of the busbars is in particular advantageous if the busbars are mechanically connected to one another. In this case, the same connectors can be used over the length of the busbar in order to fix the busbars to one another. Alternatively or additionally, the busbars can be connected to one another by means of an insulator or insulating material arranged between the busbars. The parallel arrangement of the busbars requires an insulator with a constant thickness, which is particularly simple to produce. In addition, it is simple to arrange an insulator with a constant thickness between the busbars.

The region of the semiconductor modules in which a parallel arrangement is particularly advantageous in particular includes the region of the busbars lying between the connections of the busbars for connection to the semiconductor modules.

In a further advantageous embodiment of the invention, an insulating material is arranged between the first busbar and the second busbar. The use of insulating material between the first and the second busbar has several advantages. On the one hand, the insulating effect of the insulating material enables the busbars to be arranged at a particularly short distance to one another. In addition, the insulating material enables the fixation of the busbars to one another and the creation of a compact, easy-to-assemble unit. The insulating material enables the busbars to be arranged parallel to one another in a simple way. In addition, the insulating material can prevent corrosion between the busbars.

In a further advantageous embodiment of the invention, the first and/or the second busbar comprises at least one separator, which is arranged at a right angle on the remaining part of the busbar, and connects the busbar to at least one of the DC voltage connections or one of the AC voltage connections of one of the semiconductor modules, wherein the separator is arranged along a surface of the one semiconductor module. In this embodiment, the busbars can be arranged in parallel and at a short distance to one another in a particularly simple manner. The region of the connections is formed by separators. Herein, differences in the positioning of the connections on the semiconductor module can be compensated in a simple manner by the embodiment of the separator. The current through the semiconductor module (module current) is returned through the corresponding separator to the region of the busbars arranged at a short distance. This region of the busbar, which is located outside the separators is referred to as the remaining part of the busbar. Since the separator is arranged along the surface of the semiconductor module, the passage of the currents through the module and through the corresponding separator is almost parallel. This almost parallel current conduction effect mutual compensation of magnetic fields so that the module current virtually generates no magnet field that acts on the currents through the other semiconductor modules. This achieves particularly good magnetic decoupling of the individual module currents. In other words, in this embodiment, inductive coupling between the individual module currents is particularly low. Since inductive coupling between the individual module currents results in maldistribution of the currents between the individual semiconductor modules, this embodiment can achieve particularly uniform splitting of the currents between the semiconductor modules.

In a further advantageous embodiment of the invention, the first busbar and the second busbar are arranged at least partially overlapping in the environment of the semiconductor modules. The overlapping arrangement provides the option of providing a compact busbar arrangement, which can be used in a particularly simple manner during the installation of a phase module. In particular when an insulating material is arranged between the busbars, the overlapping arrangement provides a particularly stable construction for the busbar. This construction is in particular distortion-resistant and hence can also wholly or partially absorb forces, such as, for example, weight forces of the semiconductor modules. In addition, the busbars can contribute to the overall stability of the mechanical construction of the phase module, so that it is possible to save on material for the establishment of high stability, such as is required for use in vehicles, for the construction. Hence, the overlapping arrangement enables a particularly stable and/or distortion-resistant construction to be achieved with respect to weight.

In addition, it is particularly simple to arrange the busbars in parallel. A further advantage consists in the connection of the busbars to one another in a simple manner by means of corresponding connectors and/or an insulating layer arranged between the busbars and hence the provision of a particularly stable structure unit.

In addition, the currents through the different busbars compensate the resulting magnetic fields. As a result, magnetic coupling to other circuits or other phase modules of the power converter is reduced to the greatest degree possible. The overlapping arrangement means the effective area for the inductance of the circuit for individual module currents is the same size. This results in uniform splitting of the total current between the individual module currents.

In a further advantageous embodiment of the invention, the phase module comprises a third busbar, wherein the third busbar is connected to further DC voltage connections of the semiconductor modules, wherein the first busbar, the second busbar and the third busbar are arranged at least partially overlapping in the environment of the semiconductor modules. This type of busbar system results in a compact busbar arrangement for electrically contacting a phase module with two DC voltage connections and one AC voltage connection in a particularly simple manner. The overlapping construction of three busbars endows the busbar arrangement with a high thickness that contributes significantly to a stable construction. In addition, this construction is particularly compact. Hence, the construction of the corresponding phase module can also be particularly small and space-saving. Hence, the region of high field strengths due to the different potentials inside a power converter is very small and restricted to the immediate environment of the busbar package and can, in particular with the use of insulating materials between the busbars, be managed in a simple and inexpensive manner.

In a further advantageous embodiment of the invention, the busbars are arranged such that, during the operation of the phase module, the areas spanned by the respective meshes of the module currents of the individual semiconductor modules are identical. The meshes result from the current paths of individual module currents. The current paths are formed by the busbars and the lines to a load. However, the lines to the load generally have no influence on the effective area since the different phases are conducted in the immediate vicinity of one another. Hence, the effective area is in particular influenced by the busbars in the region of the semiconductor modules. Such an arrangement, for example closely spaced guidance of the busbars with respect to one another, enables the difference in the effective areas to be reduced far enough to effect uniform splitting of currents between the individual semiconductor modules of a phase module.

In a further advantageous embodiment of the invention, the parallel semiconductor modules are controlled synchronously. Since, the structural circumstances mean the current splitting between the individual semiconductor modules is already almost the same, it is possible to dispense with interventions by means of special automatic control technology in order to influence the current splitting. Influence of this kind can be achieved in that the parallel semiconductor modules are controlled independently of one another. This requires separate control of the semiconductor modules, wherein the control is provided on the basis of measured module currents. Uniform splitting of the total current between the individual module currents enables influence by means of such automatic control technology to be dispensed with. The almost identical inductance ratios mean that uniform current splitting can be achieved in respect of both self-induction and inductive coupling. The advantage consists in the fact that it is not necessary to evaluate measured values of the different module currents. Hence, it is possible to dispense with the determination of measured values and processing and/or evaluation of such data. Hence, no separate control assemblies are required for the parallel semiconductor modules, since the semiconductor modules are controlled synchronously, i.e. simultaneously.

BRIEF DESCRIPTION OF THE DRAWING

The following describes and explains the invention in more detail with reference to the exemplary embodiments depicted in the figures, which show:

FIG. 1 a circuit diagram of a parallel connection of three semiconductor modules, FIG. 2 a typical construction of a semiconductor module, FIG. 3 a known arrangement of semiconductor modules and busbars, FIG. 4 a spatial course of the current paths, FIG. 5 effective areas of the current paths, FIG. 6 an exemplary embodiment of the arrangement of two busbars, FIG. 7 an exemplary embodiment of busbars with separators, and FIG. 8 effective areas of the current paths of the above-described exemplary embodiment.

DETAILED DESCRIPTION OF PREFERRED EMBODIMENTS

Figure 1:
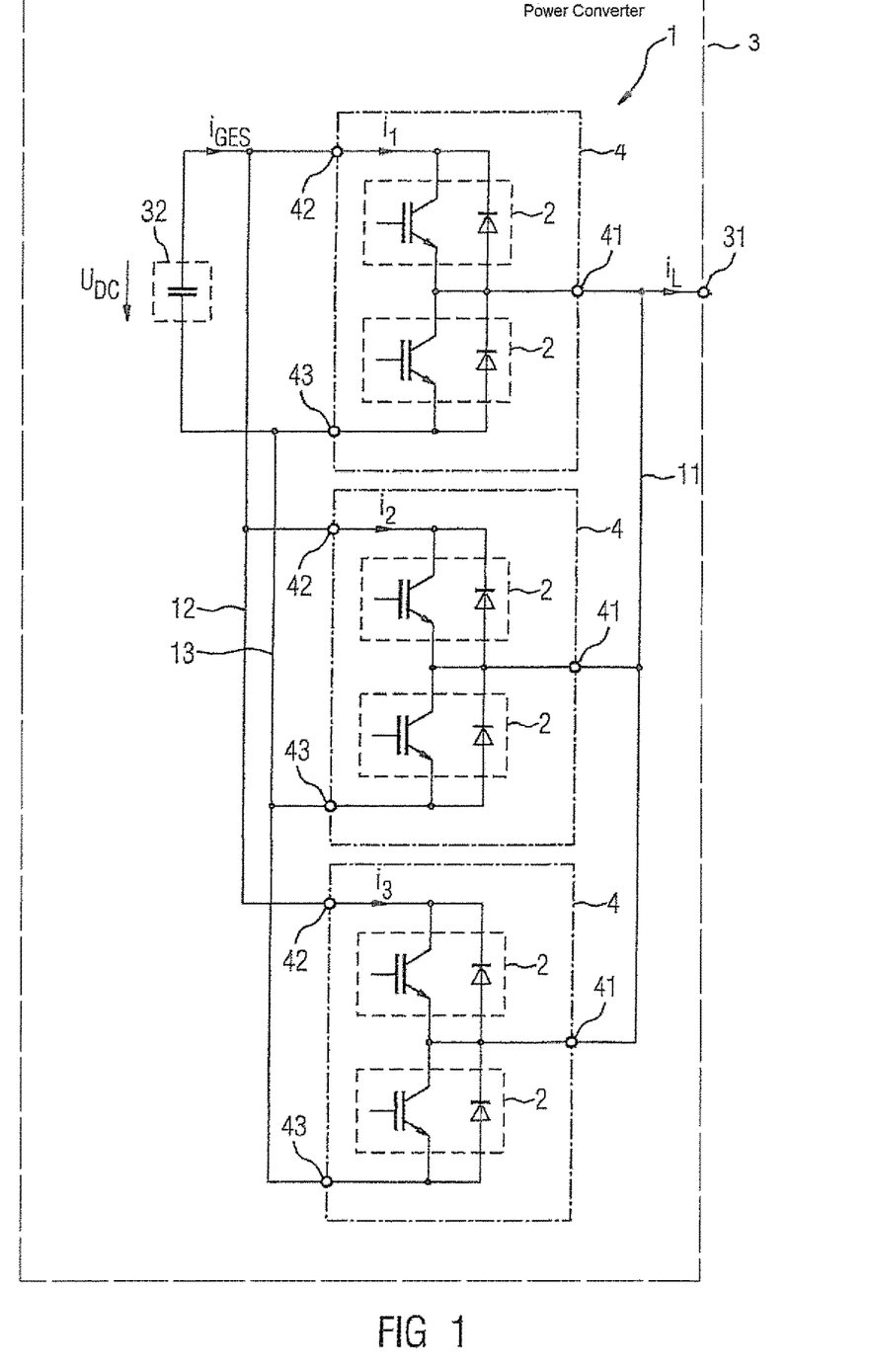

FIG. 1 shows an exemplary embodiment of a circuit in which three semiconductor modules 4 are arranged in a parallel connection. The parallel connection is established with respect to its AC voltage connections 41, which can, for example, form a phase 31 of a power converter 3. Herein, the AC voltage connections 41 are connected to one another by means of a first busbar 11. Herein, this figure only shows the circuit, i.e. the electrical connection. The depiction in the figure does not provide any information on the location of the individual components in the room.

On the DC voltage side, each semiconductor module 4 has a DC voltage connection 42 and a further DC voltage connection 43 each of which is connected to a potential of the intermediate circuit. The potential difference is the intermediate circuit voltage $U_{DC}$. This is applied to the intermediate-circuit capacitor 32. The DC voltage connections 42 or further DC voltage connections 43 are each connected to one another via a second busbar 12 and a third busbar 13. Herein, it is irrelevant whether the DC voltage connections 42 represent the positive potential of the intermediate circuit (as depicted in FIG. 1) or the negative potential. The same applies to the further DC voltage connections 43 and for the second and third busbar 12, 13.

In a simple case in which the intermediate circuit has two different potentials, each of the semiconductor modules 4 in each case comprises at least two semiconductor switches 2, which can electrically connect the AC voltage output 41 to the DC voltage connection 42 or the further DC voltage connection 43. Herein, the total current $i_{GES}$ of the intermediate circuit is split between the module currents $i_1$, $i_2$, $i_3$ through the individual semiconductor modules 4 and form the load current $i_L$, which flows to a load 5, not shown. The current is driven by the current through the intermediate circuit voltage $U_{DC}$.

In the example depicted, the current in each case flows through the uppermost semiconductor switch 2 depicted. However, depending upon the operating state, the current flow can also pass through the lower semiconductor switch 2.

Such a parallel connection is often used when, based on the semiconductor modules 4 provided, the performance capability of a phase module 1, in particular a phase module 1 that forms a phase of a power converter 3, is to be increased.

Figure 2:
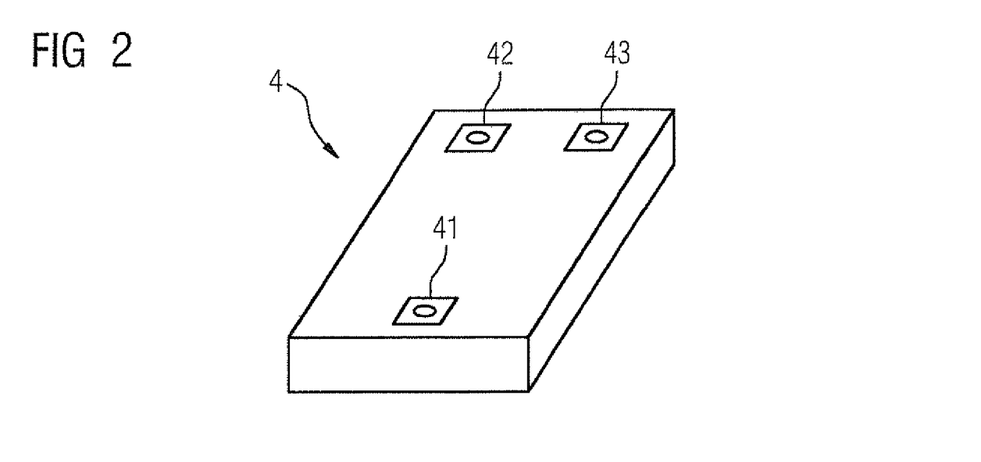

FIG. 2 shows a typical arrangement of connections 41, 42, 43 on a semiconductor module 4. Herein, the connections 41, 42, 43 are generally all located on an area of the semiconductor module that is also referred to as the upper side of the semiconductor module. Here, the DC voltage connections 42 and the further DC voltage connections 43 are often arranged on an edge of this surface and the AC voltage connections 41 are arranged spatially separated, preferably on the opposite edge, the upper side. Herein, the connections 42, 43 can also be exchanged. In particular in the case of IGBT half-bridge modules, the DC-voltage-side connections 42, 43 are often arranged on one side of the housing and the AC-voltage-side connection 41 on the other side.

Figure 3:
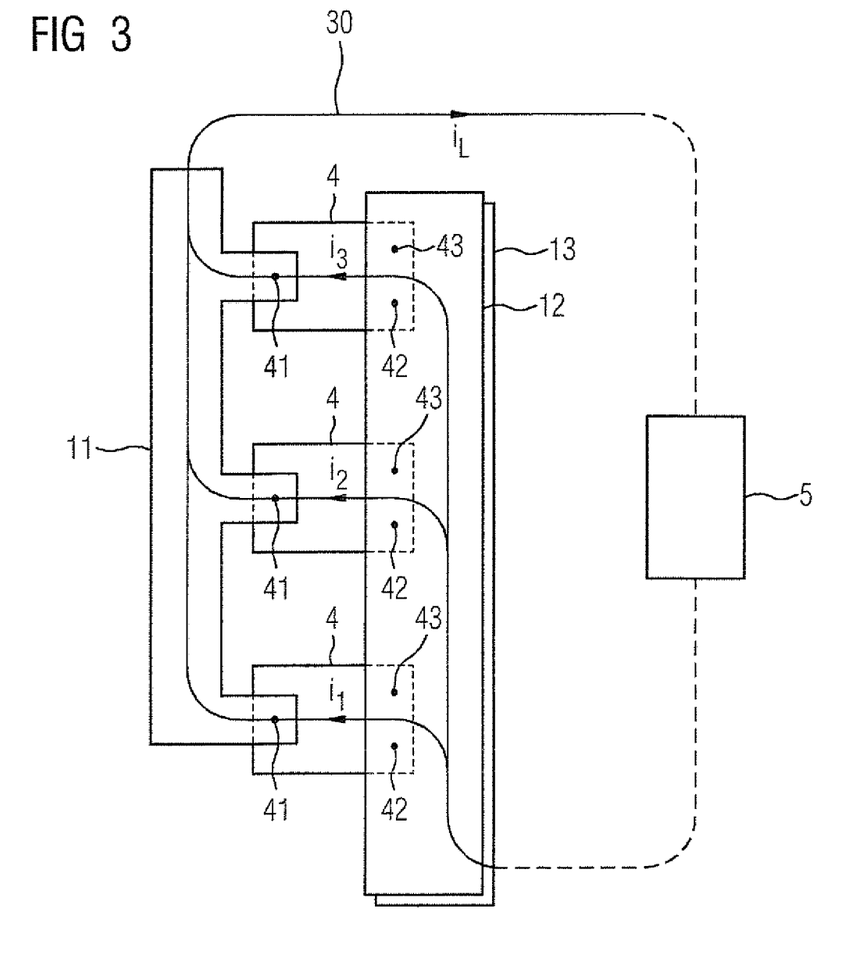

FIG. 3 shows the known typical construction of semiconductor modules 4 and busbars 11, 12, 13. Parallel connection of semiconductor modules 4 results in an arrangement such as that depicted in this figure. The first busbar 11 connects the AC voltage connections 41, the second busbar 12 connects the DC voltage connections 42 and the third busbar 13 connects the further DC voltage connections 43. In the region of the connections, in particular with the second and third busbar, care should be taken to ensure that the different connections 42, 43 are insulated from one another. This is, for example, ensured by holes in the respective busbar 12, 13, which is installed on the side facing the semiconductor modules 4. Herein, the semiconductor modules 4 carry the respective module current $i_1$, $i_2$, $i_3$, which is superimposed on, i.e. added to, the load current $i_L$. Herein, current paths are formed, which are enclosed by the individual semiconductor modules 4 and the load 5 and which are referred to as meshes 30 and are identified in the region of the semiconductor modules 4 in FIG. 3. The precise course in the vicinity of the load 5 and back to the intermediate circuit, or its busbars 12, 13 is not relevant here and is therefore depicted by dashed lines.

Figure 4:
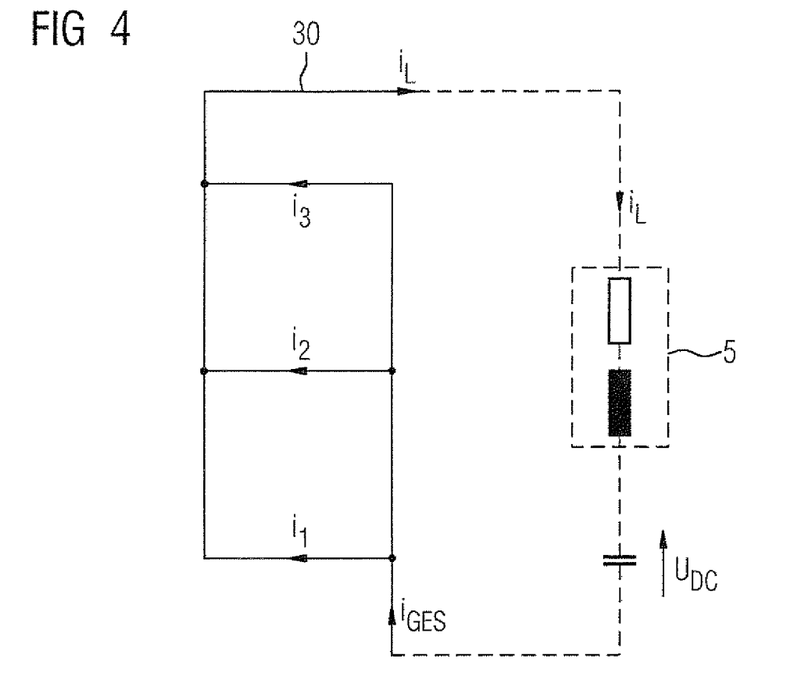
Figure 5:
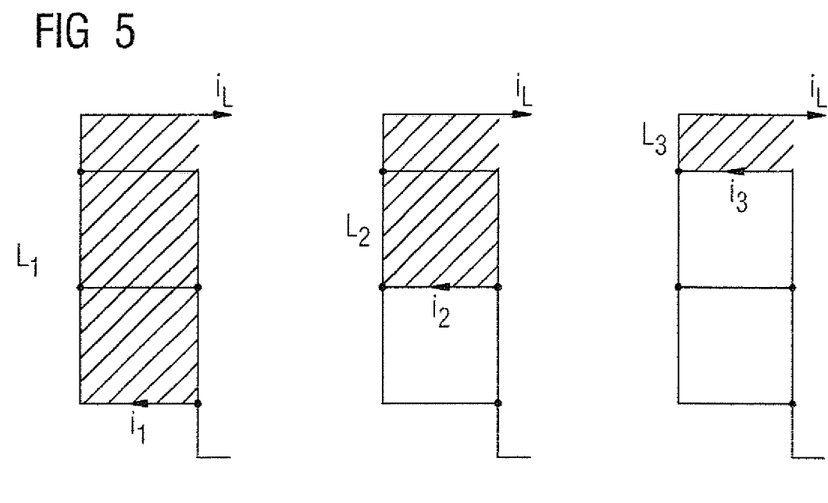

FIG. 4 shows the spatial distribution of the individual module currents $i_1$, $i_2$, $i_3$ such as results from an arrangement as shown in FIG. 3. On observation of the enclosed areas of the individual meshes 30, it is easy to identify that they form areas of different sizes in the region of the semiconductor modules (continuous line for the mesh 30). The differences are depicted again more precisely in FIG. 5. Herein, the enclosed area influences the degree of inductance $L_1$, $L_2$, $L_3$ of the corresponding mesh 30, or the corresponding current path. The different areas, which are depicted in FIG. 5 for the individual module currents $i_1$, $i_2$, $i_3$ also result in different inductances in the different current paths. In addition, these areas are dependent upon the location of the line for the load current $I_L$ and magnetically coupled to one another. Subsequent temporal changes in the load current cause uneven splitting of the load current between the parallel-connected semiconductor modules 4, in particular when using IGBT modules. As a result, the parallel-connected IGBT modules are exposed to different current strengths and their respective current-carrying capacity cannot be fully utilized.

Therefore, in one embodiment of the invention, at least the first busbar 11 and the second busbar 12 are arranged spatially close to one another. In the exemplary embodiment depicted in FIG. 6, these busbars 11, 12 are arranged overlapping. To improve the insulation of these busbars 11, 12, an insulating material 14 can be arranged between them. This enables a particularly short distance between two busbars, even with large potential differences. In the region of the connection, which is not in the vicinity of the overlapping region, the first busbar 11 depicted comprises a separator 15 that ensures the electrical connection to the AC voltage connection 41. Alternatively or additionally, it is possible also to establish the connection of the DC voltage connections 42 and/or further DC voltage connections 43 with separators 15 on the corresponding busbars 12, 13. This increases the degree of freedom in the spatial arrangement of the closely spaced busbars 11, 12, 13.

Figure 6:
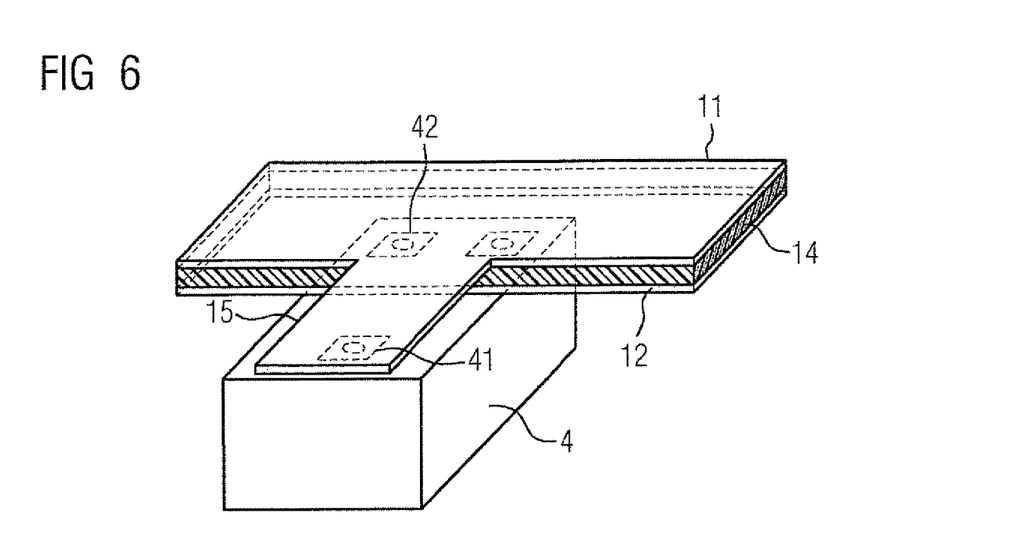

The arrangement of the separator 15 along the surface of the semiconductor module 4 also ensures that a module current $i_1$, $i_2$, $i_3$ through the semiconductor module 4 is routed back almost parallel to the region of the busbars. This at least almost parallel current conduction causes a low magnetic field and hence low magnetic coupling to the module currents of the remaining semiconductor modules 4.

Figure 7:
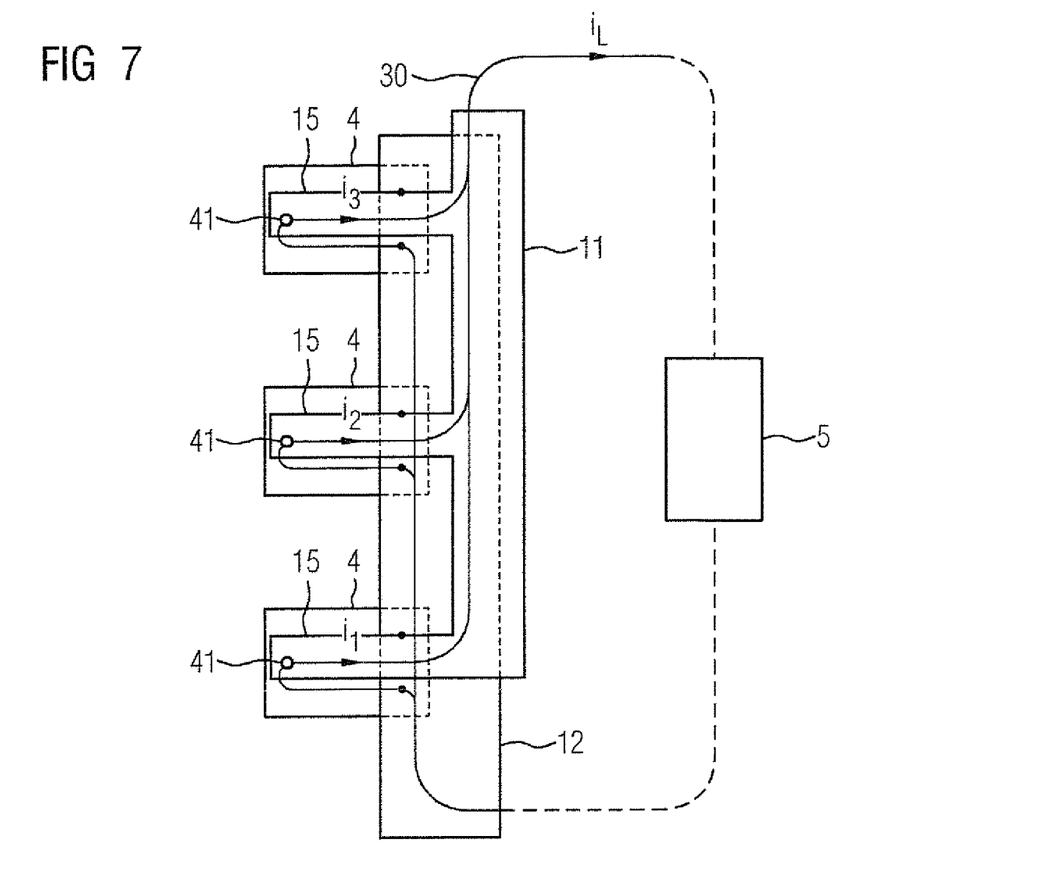

FIG. 7 shows an arrangement with parallel semiconductor modules 4, which are connected to one another via busbars 11, 12. In this exemplary embodiment, the first busbar 11 and the second busbar 12 are arranged at a short distance to one another. The separators 15 of the busbar 11 cause the current path from the AC voltage connection 41 of the semiconductor module 4 to run almost parallel to the current flow in the interior of the semiconductor module 4.

Figure 8:
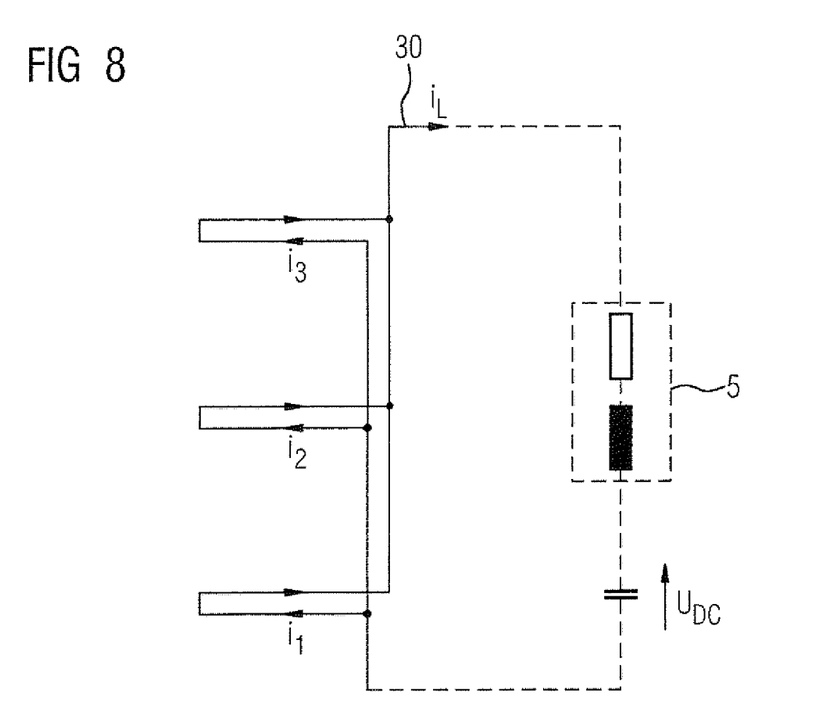

Hence, the areas that are depicted in FIG. 8 and formed by the respective current paths, or by the individual meshes 30, through the individual parallel-connected semiconductor modules 4 with the line for the load current $I_L$ are minimized or eliminated. The meshes 30 of the individual module currents $i_1$, $i_2$, $i_3$ now each have the same areas, since the conduction of the current through the separators 15 spans no areas, or almost no areas, in the region of the semiconductor modules 4. This is because the AC voltage connections 41 of the semiconductor modules 4 are returned directly via the respective module in the direction of the DC-voltage-side connections 42, 43. As a result, there are no area differences in the different meshes 30 and nor does the parallel current conduction through the semiconductor module 4 and back to the overlapping region of the busbars result in a magnetic field, which could have a disruptive effect on the remaining module currents. Even if it is not possible to prevent the formation of a magnetic field, said field is so small that there is no significant impact on the remaining module currents and the splitting of the module currents. The individual returned AC voltage connections 41 are then connected to one another by the first busbar 11, which is arranged in the vicinity of, in particular above, the second and/or third busbar 12, 13. Herein, it is advantageous, for the distances between the first busbar 11, which is connected to the AC voltage connections 41, and the semiconductor modules 4 and/or the second/third busbar 12, 13 to be established as short as possible. As a result, the areas, which are enclosed by forward and reverse current through each individual module, are minimized and are now independent of the installation of the connection line for the load current $i_L$. In addition, the magnetic couplings between these areas are minimized. This achieves magnetic decoupling of the individual module currents $i_1$, $i_2$, $i_3$ from one another.

To summarize, the invention relates to a phase module for a power converter comprising first busbar, a second busbar and at least two semiconductor modules, wherein the first busbar is connected to AC voltage connections of the semiconductor modules, wherein the second busbar is connected to DC voltage connections of the semiconductor modules. In order to improve the operating behavior of a phase module having parallel semiconductor modules, it is suggested that the first and the second busbar are arranged, at least in sections, at a distance to one another the value of which is less than half the value of the distance between the AC voltage connection and the DC voltage connection of one of the semiconductor modules, wherein the first and/or the second busbar (11,12) has at least one separator (15), which is arranged at a right angle on the remaining part of the busbar (11,12) and connects the busbar (11,12) to at least one of the DC voltage connections (42) or one of the AC voltage connections (41) of one of the semiconductor modules (4), wherein the separator (15) is arranged along a surface of the one semiconductor module (4). The invention further relates to a power converter with at least two phase modules of this type, wherein the AC voltage connections of the phase modules form the phase connections of the power converter. The invention further relates to a method for operating a phase module of this type or a power converter of this type, wherein the control of the parallel semiconductor modules occurs independently of the module current through the respective semiconductor module.

The invention claimed is:

1. A phase module for a power converter, said phase module comprising:
   at least two parallel semiconductor modules having each an AC voltage connection and a DC voltage connection which are spaced apart in a module direction;
   a first busbar having a longitudinal extent perpendicular to the module direction and connected to the DC voltage connection of each of the semiconductor modules; and
   a second busbar having a longitudinal extent substantially parallel to the longitudinal extent of the first busbar and comprising for each of the at least two parallel semiconductor modules a separator which is arranged on a surface of each of the semiconductor modules in the module direction between the AC voltage connection and the DC voltage connection at a right angle to the longitudinal extent of the second busbar and has a distal end connected to the AC voltage connection of a respective semiconductor module the separator defining an AC current path for an AC current flowing from the second busbar through the separator to the AC voltage connection of the respective semiconductor module in a first current flow direction and being routed back inside the respective semiconductor module to the first busbar in a second current flow direction opposing the first current flow directon, thereby reducing magnetic coupling to others of the at least two parallel semiconductor modules.

2. The phase module of claim 1, wherein the first and second busbars are embodied and/or arranged such that, during operation of the phase module, areas spanned by meshes of module currents of individual ones of the semiconductor modules are substantially identical.

3. The phase module of claim 1, wherein a value of a distance in at least one section of the first and second busbars is of an order of magnitude that ensures reliable insulation between the first and second busbars.

4. The phase module of claim 1, wherein a value of a distance in at least one section of the first and second busbars is less than a value of a width or thickness of at least one of the first and second busbars.

5. The phase module of claim 1, wherein the first and second busbars are arranged parallel to one another in a region of the semiconductor modules.

6. The phase module of claim 1, further comprising an insulating material arranged between the first busbar and the second busbar.

7. The phase module of claim 1, further comprising a third busbar connected to a further DC voltage connection of each of the semiconductor modules, said first, second and third busbars being arranged at least partially overlapping in proximity of the semiconductor modules.

8. A power converter, comprising at least two phase modules, in particular three phase modules, each of the phase modules comprising at least two parallel semiconductor module having each an AC voltage connection and a DC voltage connection which are spaced apart in a module direction, a first busbar having a longitudinal extent perpendicular to the module direction and connected to the DC voltage connection of each of the semiconductor modules, and a second busbar having a longitudinal extent substantially parallel to the longitudinal extent of the first busbar and comprising for each of the at least two parallel semiconductor modules a separator which is arranged on a surface of each of the semiconductor modules in the module direction between the AC voltage connection and the DC voltage connection at a right angle to the longitudinal extent of the second busbar and has a distal end connected to the AC voltage connection of a respective semiconductor module separator defining an AC current path for an AC current flowing from the second busbar through the separator to the AC voltage connection of the respective semiconductor module in a first current flow direction and being routed back inside the respective semiconductor module to the first busbar in a second current flow direction opposing the first current flow direction, wherein the AC voltage connections of the phase modules form phases of the power converter.

9. The power converter of claim 8, wherein the first and second busbars are embodied and/or arranged such that, during operation of the phase module, areas spanned by meshes of module currents of individual ones of the semiconductor modules are substantially identical.

10. The power converter of claim 8, wherein a value of a distance in at least one section of the first and second busbars is of an order of magnitude that ensures reliable insulation between the first and second busbars.

11. The power converter of claim 8, wherein a value of a distance in at least one section of the first and second busbars is less than a value of a width or thickness of at least one of the first and second busbars.

12. The power converter of claim 8, wherein the first and second busbars are arranged parallel to one another in a region of the semiconductor modules.

13. The power converter of claim 8, wherein the phase module includes an insulating material arranged between the first busbar and the second busbar.

14. The power converter of claim 8, a third busbar connected to a further DC voltage connection of each of the semiconductor modules, said first, second and third busbars being arranged at least partially overlapping in proximity of the semiconductor modules.

15. A method for operating a phase module having at least two parallel semiconductor modules having each an AC voltage connection and a DC voltage connection which are spaced apart in a module direction, a first busbar having a longitudinal extent perpendicular to the module direction and connected to the DC voltage connection of each of the semiconductor modules, and a second busbar having a longitudinal extent substantially parallel to the longitudinal extent of the first busbar and comprising for each of the at least two parallel semiconductor modules a separator which is arranged on a surface of each of the semiconductor modules in the module direction between the AC voltage connection and the DC voltage connection at a right angle to the longitudinal extent of the second busbar and has a distal end connected to the AC voltage connection of each of the semiconductor modules, said separator being arranged on a surface of each of the semiconductor modules in the module direction between the AC voltage connection and the DC voltage connection, of a respective semiconductor module the separator defining an AC current path for an AC current flowing from the second busbar through the separator to the AC voltage connection of the respective semiconductor module in a first current flow direction and being routed back inside the respective semiconductor module to the first bulbar in a second current flow direction opposing the first current flow direction, said method comprising controlling the at least two parallel semiconductor modules of the phase module independently of a module current through respective ones of the at least two parallel semiconductor modules.

16. The method of claim 15, wherein the at least two parallel semiconductor modules are controlled synchronously.

* * * * *